(12) United States Patent
Chang et al.

(10) Patent No.: US 6,188,305 B1
(45) Date of Patent: Feb. 13, 2001

(54) TRANSFORMER FORMED IN CONJUNCTION WITH PRINTED CIRCUIT BOARD

(75) Inventors: Chi Shih Chang, Austin, TX (US); Michael Joseph Johnson, Raleigh, NC (US); Craig Neal Johnston, Concord, NH (US); John Matthew Lauffer, Waverly, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 08/569,529

(22) Filed: Dec. 8, 1995

(51) Int. Cl.[7] .................................................. H01K 41/06
(52) U.S. Cl. .......................... 336/200; 336/206; 336/232
(58) Field of Search .................................... 336/200, 232, 336/229, 206

(56) References Cited

U.S. PATENT DOCUMENTS

| | | | |
|---|---|---|---|
| 3,267,402 | * | 8/1966 | Reimer .................................. 336/200 |
| 4,249,229 | * | 2/1981 | Hester .................................. 336/200 |
| 4,308,513 | * | 12/1981 | Layton et al. ........................ 336/200 |
| 4,547,961 | | 10/1985 | Bokil et al. . |
| 4,847,986 | | 7/1989 | Meinel . |
| 4,975,671 | * | 12/1990 | Dinks .................................... 336/229 |
| 5,027,255 | | 6/1991 | Zeitlin et al. . |
| 5,134,770 | | 8/1992 | Yerman et al. . |
| 5,155,648 | | 10/1992 | Gauthier . |
| 5,283,707 | | 2/1994 | Conners et al. . |
| 5,291,173 | | 3/1994 | Yerman et al. . |
| 5,321,380 | | 6/1994 | Godek et al. . |

FOREIGN PATENT DOCUMENTS

| | | | |
|---|---|---|---|
| 0481755 | | 4/1992 | (EP) . |
| 2-10705 | * | 1/1990 | (JP) ...................................... 336/200 |

OTHER PUBLICATIONS

IBM Technical Disclosure Bulletin vol. 38, No. 2, Feb. 1995, 'Printed Circuit Board Wire And Device Add Process', by Boyko et al.

IBM Technical Disclosure Bulletin vol. 16, No. 9, Feb. 1994, 'Flexible Circuit Solenoid', by Gonnella et al.

* cited by examiner

*Primary Examiner*—Michael L. Gellner
(74) *Attorney, Agent, or Firm*—Arthur J. Samodovitz

(57) ABSTRACT

A transformer comprises a printed circuit board having elongated conductors printed thereon, a ferrite core having a bottom mounted onto the printed circuit board and a flex circuit. The flex circuit comprises a dielectric sheet and elongated conductors printed on both faces of the sheet. The flex circuit is contoured around a top and sides of the core. The conductors of the flex circuit are surface bonded to respective conductors of the printed circuit board to form a series of primary windings and a series of secondary windings around the core. Provision of the upper portions of the windings by means of the flex circuit is economical because it does not require handling of discrete conductor portions.

3 Claims, 5 Drawing Sheets

TRANSFORMER FORMED IN CONJUNCTION WITH PRINTED CIRCUIT BOARD

BACKGROUND OF THE INVENTION

The invention relates generally to transformers, and deals more particularly with a transformer formed in conjunction with a printed circuit board.

Transformers are widely used today for power supplies, power converters and other circuits where electrical/ground isolation, impedance matching or voltage transformation are required. Known transformers comprise a ferrite core and primary and secondary windings wrapped around the core. Typically the core is toroidal in shape, either round or square. The primary and secondary windings are wrapped around the sidewalls of the core and either interlaced with each other or wrapped around separate sections of the core. There are various known techniques to form the windings. For example, the windings can be simple copper wires wound around the core with the free ends joined and soldered to other circuitry as required by the application.

U.S. Pat. No. 4,847,986 discloses another transformer which is formed with a printed circuit board. The core is mounted onto a printed circuit board. Underneath the core, elongated printed conductors form segments of respective windings. Metallic wires are contoured over the top and two sides of the core, and are wire bonded to ends of respective printed conductors to form continuous strings of primary and secondary windings which surround the core. While this technique has the advantages of low profile and conjunction with a printed circuit board, further improvements are desirable to lower the cost of construction.

European patent application #91309527.9 also discloses a core mounted onto a printed circuit board. Underneath the core, elongated printed conductors form segments of respective windings. Metallic strips are contoured over the top and two sides of the core, and are surface bonded to ends of respective printed conductors to form continuous strings of primary and secondary windings which surround the core. While this technique has the advantages of low profile and conjunction with a printed circuit board, further improvements are desirable to lower the cost of construction.

Accordingly, an object of the present invention is to provide a transformer (or inductor) formed in conjunction with a printed circuit board but with lower cost of construction than and comparable electrical and thermal performance as the foregoing prior art.

SUMMARY OF THE INVENTION

The invention resides in an electromagnetic device comprising a printed circuit board having elongated conductors printed thereon, a ferrite core having a bottom mounted onto the printed circuit board and a flex circuit. The flex circuit comprises a dielectric sheet and elongated conductors printed on the sheet. The flex circuit is contoured around a top and sides of the core. The conductors of the flex circuit are surface bonded to respective conductors of the printed circuit board to form a series of windings around the core. Provision of the upper portions of the windings by means of the flex circuit is more economical than by the discrete conductor portions of the foregoing prior art.

According to one embodiment of the present invention, the flex circuit comprises primary winding portions printed on one side of the sheet and secondary winding portions printed on the other side of said sheet.

DETAILED DESCRIPTION OF THE PREFERRED EMBODIMENTS

Figure 1:
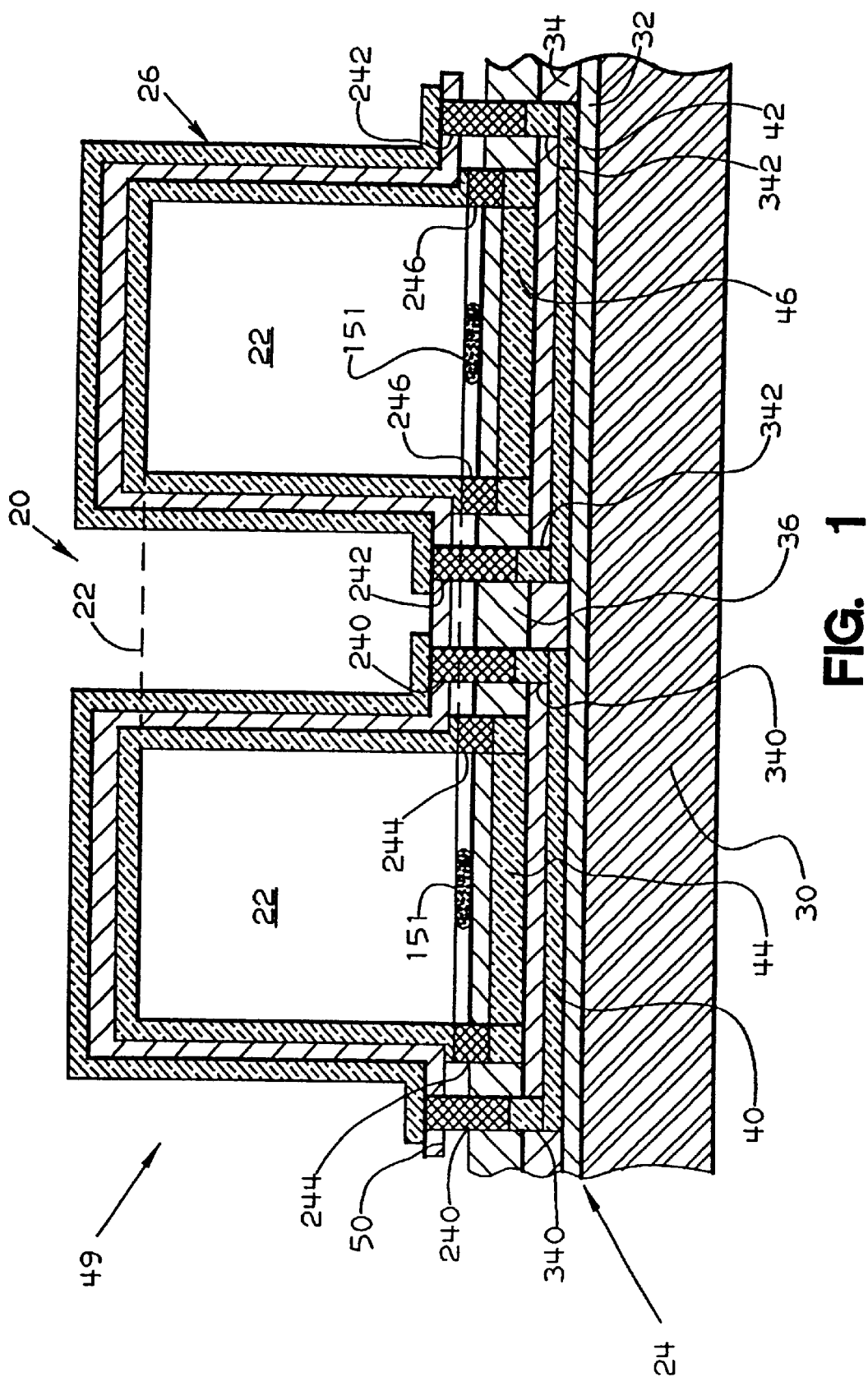
FIG. 1 is a cross-sectional view of a transformer according to the present invention.

Referring now to the figures in detail, wherein like reference numbers indicate like elements throughout, FIG. 1 illustrates a transformer generally designated 20 according to the present invention. Transformer 20 comprises a square toroidal ferrite core 22, a printed circuit board 24 which supports the core and includes printed conductors which form part of the windings, and a flex circuit 26 which is bent/contoured over the core and includes printed conductors that form the remaining parts of the windings.

The square toriodal ferrite core 22 is well known in the industry and is formed by well known ceramic forming techniques such as ram pressing or extrusion followed by high temperature sintering of the ferrite material. The length and width of the core are sufficient to accommodate the required number of primary and secondary windings. The cross-sectional area of the core is sufficient to keep the flux density and heat dissipation low enough for the intended application.

Figure 2:
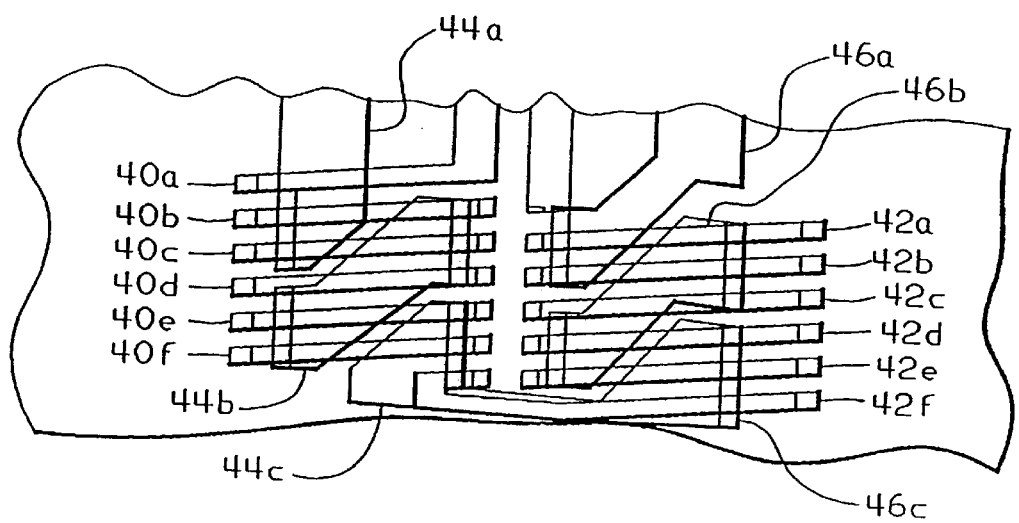
FIG. 2 is a top view of the printed circuit board of the transformer of FIG. 1.

The printed circuit board 24 comprises a metal back plate 30 (which is optional), dielectric layers 32, 34 and 36, printed primary winding portions 40*a–f* and 42*a–f* (shown collectively in FIG. 1 as 40 and 42 and individually in FIG. 2) and printed secondary winding portions 44*a–c* and 46*a–c* (shown collectively in FIG. 1 as 44 and 46 and individually in FIG. 2). Twelve conductive vias 340 are provided through dielectric layer 34, and openings are provided in dielectric layer 36 to allow electrical connection from pads 240 to primary winding portions 40. Similarly, twelve conductive vias 342 are provided through dielectric layer 34, and openings are provided in dielectric layer 36 to allow electrical connection from pads 242 to primary winding portions 42. Four openings are provided in dielectric layer 36 to allow electrical connection from pads 244 to secondary winding portions 44. Similarly, four openings are provided in dielectric layer 36 to allow electrical connection from pads 246 to secondary winding portions 46. As described in more detail below, the winding portions of the printed circuit board mate with respective winding portions in the flex circuit 26 to form a set of complete primary windings and a set of complete secondary windings. A suitable fabrication process for printed circuit board 24 is described in more detail in U.S. patent application Ser. No. 08/429,612, filed by J. M. Lauffer, et al on Apr. 27, 1995 and below. This is the preferred method due to its thermal properties. However, any printed circuit board, fabricated by methods well known in the industry, may be substituted.

Figure 3:
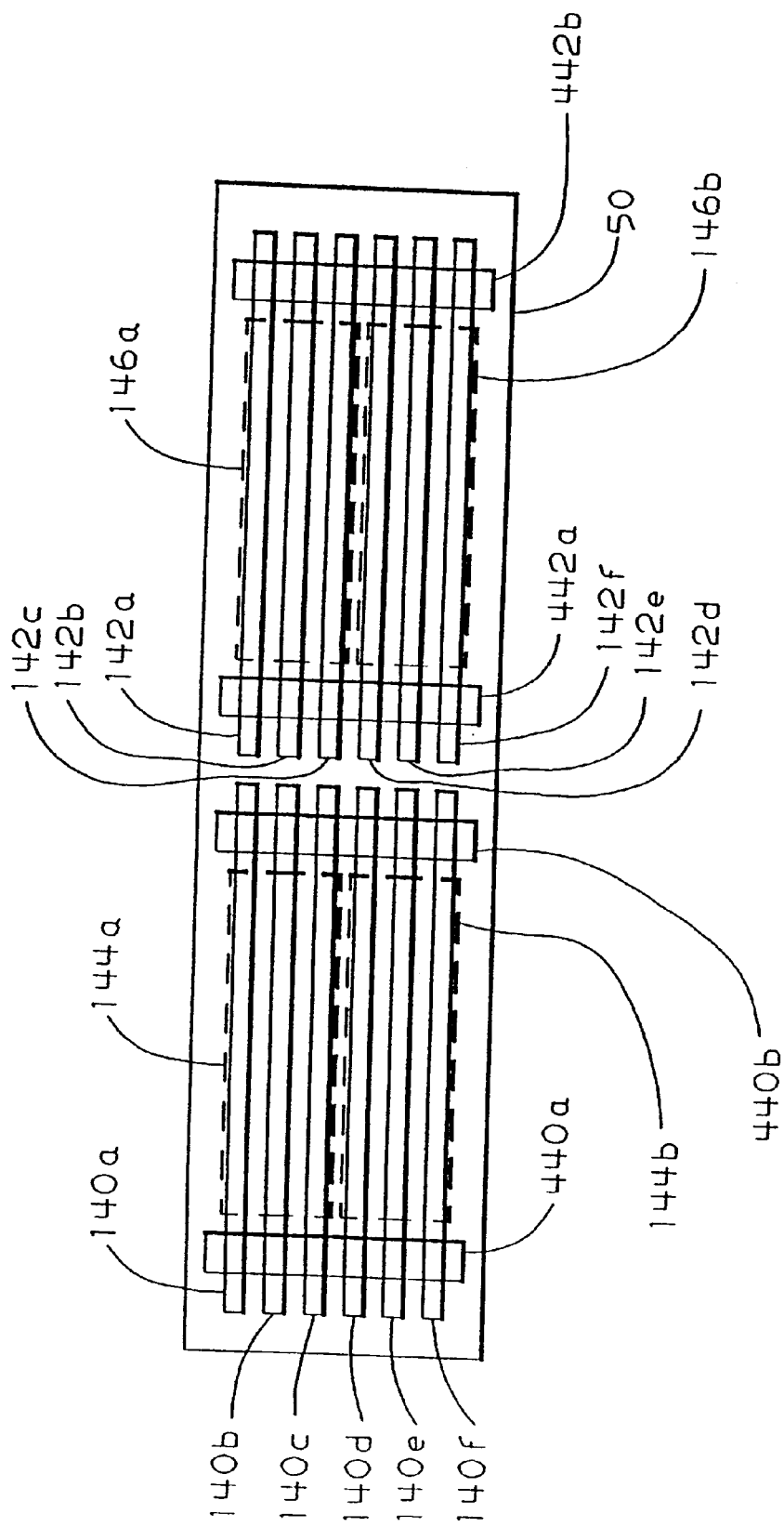
FIG. 3 is a top view of a flex circuit which is subsequently used to form part of the windings of the transformer of FIG. 1, but not yet bent/contoured onto the core.
Figure 4:
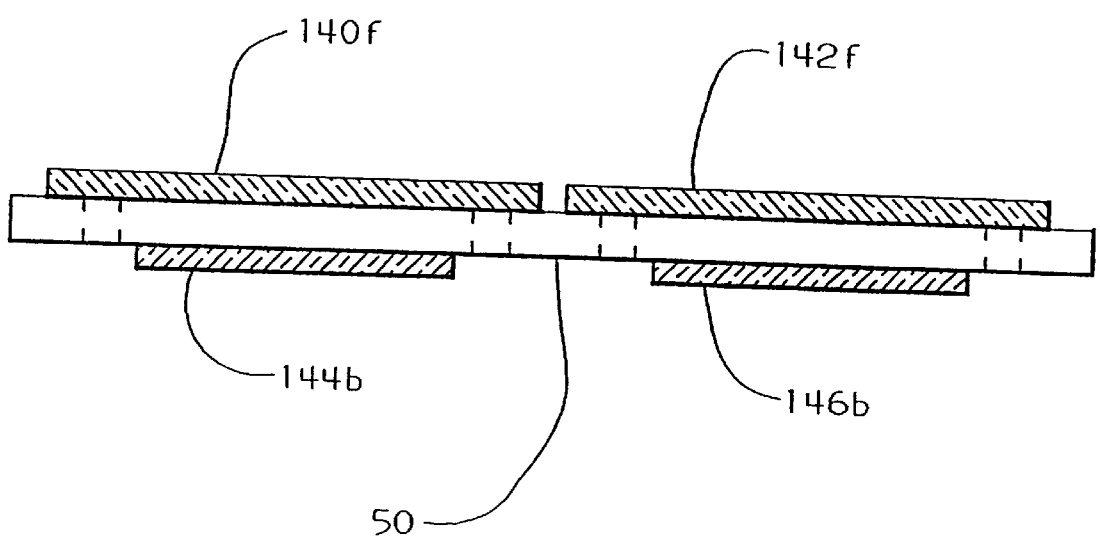
FIG. 4 is a side view of the flex circuit of FIG. 3.

FIGS. 3 and 4 illustrate the flex circuit 26 before being pressed/contoured onto the core 22. Flex circuit 26 comprises a central dielectric layer 50, for example, polyimide or Teflon (trademark of E. I. DuPont de Nemours Inc.), 0.002 inches thick. Elongated copper conductors 140*a–f* and 142a–f are printed on a top face of the dielectric layer 50, and elongated copper conductors 144a–b and 146a–b are printed on a bottom face of the dielectric layer 50. By way of example, the conductors 140a–f, 142a–f, 144a–b and 146a–b are all 0.002 inches thick and standard printed circuit photo and etch operations are used to form the conductors 140a–f, 142a–f, 144a–b and 146a–b on dielectric layer 50. After these conductors are so printed on the dielectric layer 50, rectangular windows 440a–b and 442a–b are cut through the dielectric layer 50 by etching or laser ablation to expose conductors 140a–f and 142a–f to the underside of the flex circuit 26. As an alternate to the window, the conductors 140a–f and 142a–f can be exposed to the underside of the flex circuit by conventional plated through holes, i.e. punched or drilled holes, an electroless plating of copper on the inner walls of the holes, an electrical plating of copper on the electroless plate and a fill of the resultant holes with solder.

Figure 5:
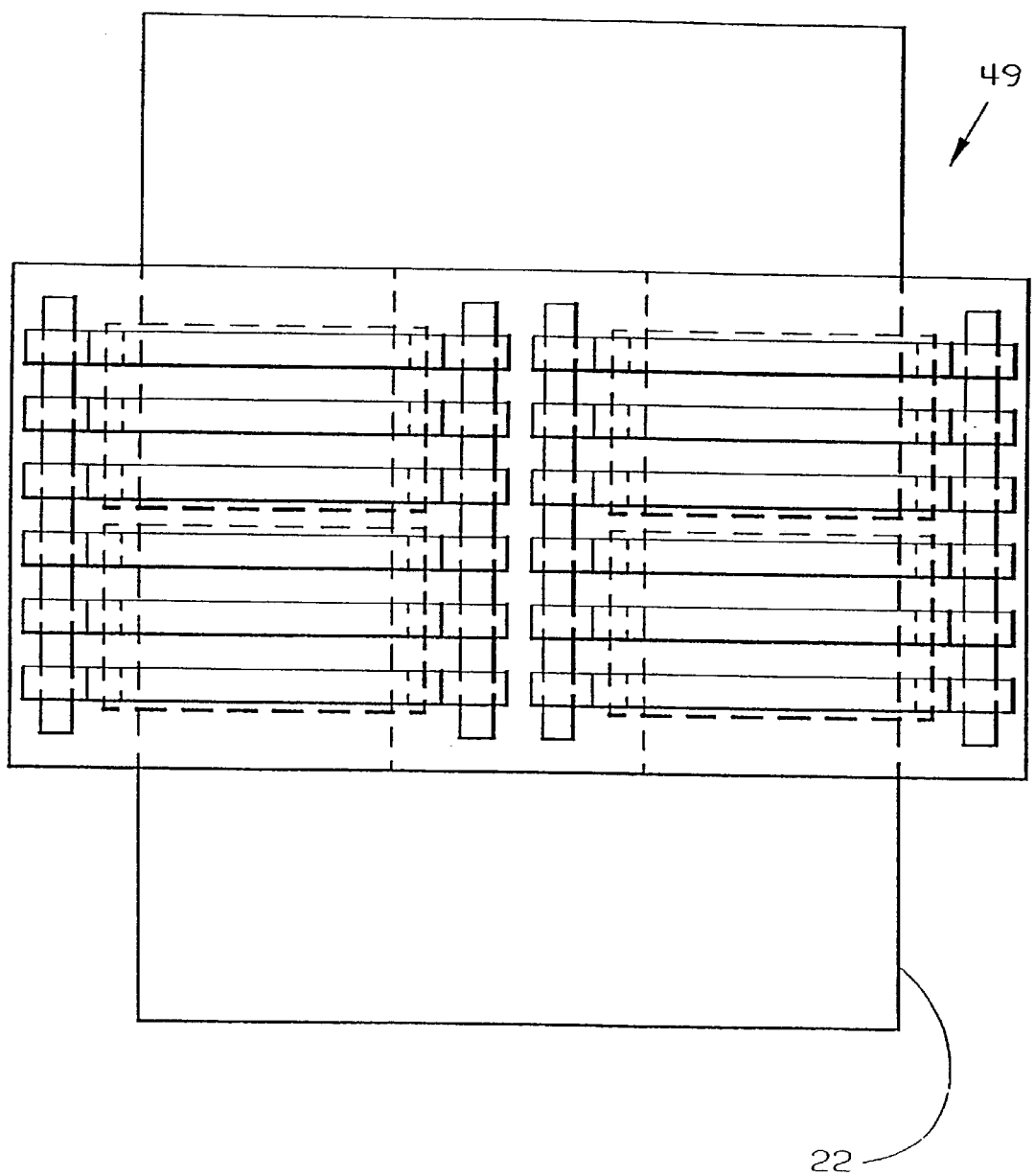
FIG. 5 is a top view of the core of the transformer of FIG. 1 with the flex circuit bent/contoured thereon.

After the flex circuit 26 is made as described above, the next step in the fabrication process is to press/bend the flex circuit 26 onto the core 22. First, an adhesive layer, for example, thermally enhanced epoxy, is spread onto the top surface of the core 22. Then, the flex circuit is brought into alignment with the core. Then, the flex circuit is pressed/bent over the core by a die press with for example, 20 psi pressure. Then, the die press is retracted. Because of the thicknesses and mechanical properties of the dielectric layer 50 and the conductors 140a–f, 142a–f, 144a–b and 146a–b, the resultant flex circuit 26 remains formed around the top and exposed sides of the core 22 and thereafter maintains the resultant contoured shape as illustrated in FIG. 5.

After the flex circuit 25 is contoured around and glued to the core 22, the resultant core assembly 49 is surface mounted to printed circuit board 24 as follows. Solder paste is screened onto pads 240 and 242 and onto pads 244 and 246. Then, a dot adhesive 151 is dispensed onto the printed circuit board 24 beneath the landing sites of the core 22, the core assembly is positioned into place, and the solder paste is reflowed to connect the printed conductors 140a–f and 142a–f to the printed conductors 40a–f and 42a–f and the printed conductors 144a–b and 146a–b to the printed conductors 44a–c and 46a–c. To improve thermal dissipation, the dot adhesive is a thermally enhanced type, for example, EPO-TEK H70E-4 or EPO-TEK 115-SMT from Epoxy Technology, Inc., and the conductors printed on the underside of the flex circuit dissipate more heat than the conductors printed on the topside of the flex circuit. The optional metal back plate 30 serves as a heat sink.

The following describes in more detail the preferred make-up of, and preferred method for making printed circuit board 24. This type of printed circuit board technology (without the transformer) is described in pending U.S. patent application Ser. No. 08/429,612. Metal plate 30 comprises copper, copper plated aluminum, copper-invar-copper, aluminum or molybdenum-copper and is thick, for example 0.020"–0.080". Each of the dielectric layers 32 and 34 comprises a thin, photo imageable solder mask material such as IBM ASMs, or IBM ASMDF material. The dielectric layer 32 is screen printed or coated by other conventional means on the top side of the metal plate 30. Either dry film apply or flood screen print techniques may be used. A copper foil of appropriate thickness, for example, 2 ounce copper, is laminated to dielectric layer 32 with sufficient heat and pressure to adhere the copper foil to the dielectric layer 32, and to provide complete cure of dielectric layer 32. The conductors 40a–f and 42a–f are then defined in the laminated copper layer by conventional photoresist and subtractive copper etch processes. A second dielectric layer 34 is then applied to the top surface in the same manner as dielectric layer 32. Likewise, a second copper foil of appropriate thickness is then laminated to dielectric layer 34. Heat and pressure of this second lamination step are sufficient to flow the coated dielectric and adhere the copper foil to dielectric layer 34, but not sufficient to cure dielectric layer 34. Conductors 44 and 46 are then formed by conventional photoresist and subtractive copper etch processes. After defining conductors 44 and 46, the dielectric layer 34 is photo-imaged and developed to create vias 340 and 342, through dielectric layer 34, exposing ends of conductors 40 and 42. The structure is then heated at sufficient time and temperature to fully cure dielectric layer 34. Next, protective coating layer 36 is applied in a conventional manner such as flood screen and image or pattern screen printing. Holes 240 and 242 to conductors 40 and 42, as well as holes 244 and 246 to conductors 44 and 46, are provided in the protective coating layer 36 by conventional means. Finishing processes such as nickel/gold plating, solder leveling, etc. may be completed in a conventional manner. Finally, the core assembly 49 is surface mounted to the printed circuit board as described above.

Based on the foregoing, a transformer formed in conjunction with a printed circuit board according to the present invention has been disclosed. However, numerous modifications and substitutions can be made without deviating from the scope of the present invention. For example, the number of primary and second windings are tailored to the desired application. Also, if desired, only the left or right half of the flex circuit 26 can be made and contoured over one leg only of the core 22. Also, flex circuit 26 can be pressed over the top and two sides of a round toroidal (donut-shaped) core instead of the square toroidal core as shown using the same die, although in this configuration the flex circuit will not "hug" the lower portions of the sides of the core. Also, the same technology as illustrated for transformer 20 can be used to form an inductor. In this case however, only a single set of conductors such as 140a–f and 142a–f is printed on the flex circuit and a single set of mating conductors 40a–f and 42a–f is printed on the printed circuit board 24 and interconnected as illustrated to form one continuous set of windings. Also, other types of printed circuit boards may be substituted for the preferred type of printed circuit board with integrated thermal carrier. The inductor core may contain a physical gap in one side, or it may likewise be constructed of an integrally gapped material such as powdered iron. Therefore, the present invention has been disclosed by way of illustration and not limitation, and reference should be made to the following claims to determine the scope of the present invention.

What is claimed is:

1. An electromagnetic device comprising:

a printed circuit board having elongated conductors printed thereon;

a ferrite core having a bottom mounted onto said printed circuit board; and a flex circuit comprising a flexible dielectric sheet and elongated conductors printed on said sheet, said flex circuit being contoured around a top and sides of said core, said conductors of said flex circuit being surface bonded to respective conductors of said printed circuit board to form a series of windings around said core; and wherein said conductors are printed on one side of said sheet and said flex circuit further comprises other elongated conductors printed on the other side of said sheet, said other conductors being surface bonded to respective conductors of said printed circuit board to form another series of windings around said core.

2. An electromagnetic device as set forth in claim 1 wherein the first said conductors of said sheet and respective conductors on said printed circuit board form a primary of a transformer and said other conductors of said sheet and respective conductors on said printed circuit board form a secondary of said transformer.

3. An electromagnetic device as set forth in claim 1 wherein the first said conductors printed on said sheet are printed on an underside of said sheet and the respective conductors on said printed circuit board reside in a higher layer than the conductors on said printed circuit board which are bonded to said other conductors on said sheet.

* * * * *